United States Patent
Tsurutani

(10) Patent No.: US 11,338,679 B2
(45) Date of Patent: May 24, 2022

(54) METHOD OF DISPLAYING RESIDUAL CAPACITY OF SECONDARY BATTERY, DISPLAY DEVICE, AND MOTOR-DRIVEN VEHICLE

(71) Applicant: HONDA MOTOR CO., LTD., Tokyo (JP)

(72) Inventor: Taisuke Tsurutani, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 88 days.

(21) Appl. No.: 16/865,440

(22) Filed: May 4, 2020

(65) Prior Publication Data
US 2020/0384860 A1  Dec. 10, 2020

(30) Foreign Application Priority Data
May 15, 2019  (JP) .............................. JP2019-092071

(51) Int. Cl.
  *G01R 31/00* (2006.01)
  *B60K 35/00* (2006.01)
  (Continued)

(52) U.S. Cl.
  CPC .......... *B60K 35/00* (2013.01); *G01R 31/3842* (2019.01); *H01M 10/488* (2013.01);
  (Continued)

(58) Field of Classification Search
  USPC ............................ 324/426, 428, 132; 702/63
  See application file for complete search history.

(56) References Cited

U.S. PATENT DOCUMENTS

| | | | | |
|---|---|---|---|---|
| 5,539,318 A | * | 7/1996 | Sasaki | G01R 19/16542 324/428 |
| 2007/0046263 A1 | * | 3/2007 | Matsushima | H02J 7/0049 320/132 |

(Continued)

FOREIGN PATENT DOCUMENTS

| | | |
|---|---|---|
| JP | 2007-017357 | 1/2007 |
| JP | 2009-002691 | 1/2009 |

(Continued)

OTHER PUBLICATIONS

Japanese Office Action for Japanese Patent Application No. 2019-092071 dated Feb. 24, 2021.

*Primary Examiner* — Vincent Q Nguyen
(74) *Attorney, Agent, or Firm* — Amin, Turocy & Watson, LLP

(57) ABSTRACT

A method of displaying a residual capacity of a secondary battery causes a computer of a display device to calculate a residual capacity of a secondary battery that stores electric power for driving a motor-driven vehicle based on an estimated value of an open-circuit voltage of the secondary battery storing the residual capacity calculated at the time of stopping of supply of electric power of the secondary battery and displaying the residual capacity at the time of stopping of supply of electric power on a display at the time of starting of supply of electric power of the secondary battery and subsequently displaying the residual capacity of the secondary battery on the display within a range with an upper limit value and a lower limit value with respect to the residual capacity at the time of stopping of supply of electric power.

9 Claims, 7 Drawing Sheets

(51) Int. Cl.
 *H01M 10/48* (2006.01)
 *G01R 31/3842* (2019.01)
(52) U.S. Cl.
 CPC .. *B60K 2370/152* (2019.05); *B60K 2370/169* (2019.05); *H01M 2220/20* (2013.01)

(56) References Cited

U.S. PATENT DOCUMENTS

2008/0243405 A1* 10/2008 Iwane ................ G01R 31/3835
 702/63
2013/0013238 A1* 1/2013 Kawakita ............ H02J 7/00716
 702/63

FOREIGN PATENT DOCUMENTS

| | | |
|---|---|---|
| JP | 4638175 | 2/2011 |
| JP | 2013-217899 | 10/2013 |
| JP | 2014-025738 | 2/2014 |
| JP | 2014-045567 | 3/2014 |
| JP | 2014-174050 | 9/2014 |

* cited by examiner

METHOD OF DISPLAYING RESIDUAL CAPACITY OF SECONDARY BATTERY, DISPLAY DEVICE, AND MOTOR-DRIVEN VEHICLE

CROSS-REFERENCE TO RELATED APPLICATION

This application claims priority to and the benefit from Japanese Patent Application No. 2019-092071, filed on May 15, 2019, the contents of which are hereby incorporated by reference into the present application.

BACKGROUND OF THE INVENTION

Field of the Invention

The present invention relates to a method of displaying a residual capacity of a secondary battery, a display device, and a motor-driven vehicle.

Description of Related Art

In a motor-driven vehicle such as an electric vehicle, when a residual capacity, for example, a state of charge (SOC), of a secondary battery (a battery) storing electric power for driving the motor-driven vehicle is displayed, a method based on an open-circuit voltage (also referred to as an "open voltage") of a secondary battery and a method of integrating a current of a secondary battery are used as a method of calculating the residual capacity of the secondary battery in the related art. These calculation methods have merits and demerits. In this regard, a technique of displaying a residual capacity of a secondary battery by weighting the residual capacities which are obtained using the two calculation methods in consideration of use conditions is known (for example, see Japanese Patent No. 4638175).

SUMMARY

While a motor-driven vehicle is traveling, a residual capacity of a secondary battery can be accurately estimated and displayed by estimating internal resistance of the secondary battery and measuring an OCV. However, when supply of electric power of the secondary battery is started after the supply of electric power has been stopped, a value which is less than an actual residual capacity is likely to be calculated due to polarization that occurs while the supply of electric power is stopped. Accordingly, the residual capacity of the secondary battery may be displayed to be unnaturally low and make an occupant uncomfortable.

The invention is made in consideration of the above circumstances and an objective thereof is to provide a method of displaying a residual capacity of a secondary battery, a display device, and a motor-driven vehicle that can decrease an uncomfortable feeling which is given to an occupant.

A method of displaying a residual capacity of a secondary battery, a display device, and a motor-driven vehicle according to the invention employ the following configurations.

(1) A method of displaying a residual capacity of a secondary battery according to an aspect of the invention is a method of displaying a residual capacity of a secondary battery, the method causing a computer of a display device to perform: calculating a residual capacity of a secondary battery that is configured to store electric power for driving a motor-driven vehicle on the basis of at least an estimated value of an open-circuit voltage of the secondary battery; storing the residual capacity of the secondary battery which is calculated at the time of stopping of supply of electric power of the secondary battery in a storage; and displaying the residual capacity of the secondary battery at the time of stopping of supply of electric power of the secondary battery, which is stored in the storage, on a display at the time of starting of supply of electric power of the secondary battery and subsequently displaying the residual capacity of the secondary battery on the display within a range with a predetermined upper limit value and a predetermined lower limit value with respect to the residual capacity at the time of stopping of supply of electric power of the secondary battery.

(2) In the aspect of (1), the computer may perform calculating the residual capacity of the secondary battery on the additional basis of an integrated value of a charging/discharging current of the secondary battery when the residual capacity of the secondary battery is calculated.

(3) In the aspect of (2), the upper limit value and the lower limit value may be values which are set on the basis of an error in calculating the residual capacity of the secondary battery.

(4) In the aspect of (3), the error may be at least one of a measurement error due to a current sensor that is configured to measure the charging/discharging current and an estimation error when the residual capacity of the secondary battery is estimated on the basis of a result of measurement from the current sensor.

(5) A method of displaying a residual capacity of a secondary battery according to an aspect of the invention is a method of displaying a residual capacity of a secondary battery, the method causing a computer of a display device to perform: calculating a residual capacity of a secondary battery that is configured to store electric power for driving a motor-driven vehicle on the basis of at least an estimated value of an open-circuit voltage of the secondary battery; storing the residual capacity of the secondary battery which is calculated at the time of stopping of supply of electric power of the secondary battery in a storage; and displaying the residual capacity of the secondary battery which is calculated at the time of starting of supply of electric power of the secondary battery or the residual capacity of the secondary battery at the time of stopping of supply of electric power of the secondary battery which is stored in the storage on a display at the time of starting of supply of electric power of the secondary battery and subsequently displaying the residual capacity of the secondary battery on the display within a range with a predetermined upper limit value and a predetermined lower limit value with respect to the displayed residual capacity of the secondary battery.

(6) In the aspect of (5), when the residual capacity of the secondary battery which is calculated at the time of starting of supply of electric power of the secondary battery or the residual capacity of the secondary battery at the time of stopping of supply of electric power of the secondary battery which is stored in the storage is displayed on the display at the time of starting of supply of electric power of the secondary battery, the computer may perform selecting one of the residual capacity of the secondary battery which is calculated at the time of starting of supply of electric power of the secondary battery or the residual capacity of the secondary battery at the time of stopping of supply of electric power of the secondary battery which is stored in the storage as the residual capacity of the secondary battery which is displayed on the display on the basis of whether a time from stopping of supply of electric power to starting of supply of electric power of the secondary battery is equal to or greater than a time in which polarization at the time of starting of supply of electric power of the secondary battery is stabilized.

(7) In the aspect of (6), when the residual capacity of the secondary battery which is calculated at the time of starting of supply of electric power of the secondary battery or the residual capacity of the secondary battery at the time of stopping of supply of electric power of the secondary battery which is stored in the storage is displayed on the display at the time of starting of supply of electric power of the secondary battery, the computer may perform selecting the residual capacity of the secondary battery at the time of stopping of supply of electric power of the secondary battery which is stored in the storage as the residual capacity of the secondary battery which is displayed on the display when the time from stopping of supply of electric power to starting of supply of electric power of the secondary battery is less than the time in which polarization at the time of starting of supply of electric power of the secondary battery is stabilized.

(8) In the aspect of (7), when the residual capacity of the secondary battery which is calculated at the time of starting of supply of electric power of the secondary battery or the residual capacity of the secondary battery at the time of stopping of supply of electric power of the secondary battery which is stored in the storage is displayed on the display at the time of starting of supply of electric power of the secondary battery, the computer may perform selecting the residual capacity of the secondary battery at the time of stopping of supply of electric power of the secondary battery which is stored in the storage as the residual capacity of the secondary battery which is displayed on the display when the time from stopping of supply of electric power to starting of supply of electric power of the secondary battery is equal to or greater than the time in which polarization at the time of starting of supply of electric power of the secondary battery is stabilized and the estimated value of the open-circuit voltage of the secondary battery is within a predetermined range.

(9) A residual capacity device for a secondary battery according to an aspect of the invention is a residual capacity display device for a secondary battery including: a calculator configured to calculate a residual capacity of a secondary battery that stores electric power for driving a motor-driven vehicle on the basis of at least an estimated value of an open-circuit voltage of the secondary battery; a storage configured to store the residual capacity of the secondary battery which is calculated at the time of stopping of supply of electric power of the secondary battery in a storage; a display configured to display the residual capacity of the secondary battery; and a display controller configured to display the residual capacity of the secondary battery at the time of stopping of supply of electric power of the secondary battery which is stored in the storage on the display at the time of starting of supply of electric power of the secondary battery and to subsequently display the residual capacity of the secondary battery on the display within a range with a predetermined upper limit value and a predetermined lower limit value with respect to the residual capacity at the time of stopping of supply of electric power of the secondary battery.

(10) A motor-driven vehicle according to an aspect of the invention is a motor-driven vehicle including the residual capacity display device for a secondary battery according to the aspect of (9).

According to the aspects of (1) to (10), it is possible to decrease an uncomfortable feeling which is given to an occupant.

DETAILED DESCRIPTION OF THE INVENTION

Figure 1:
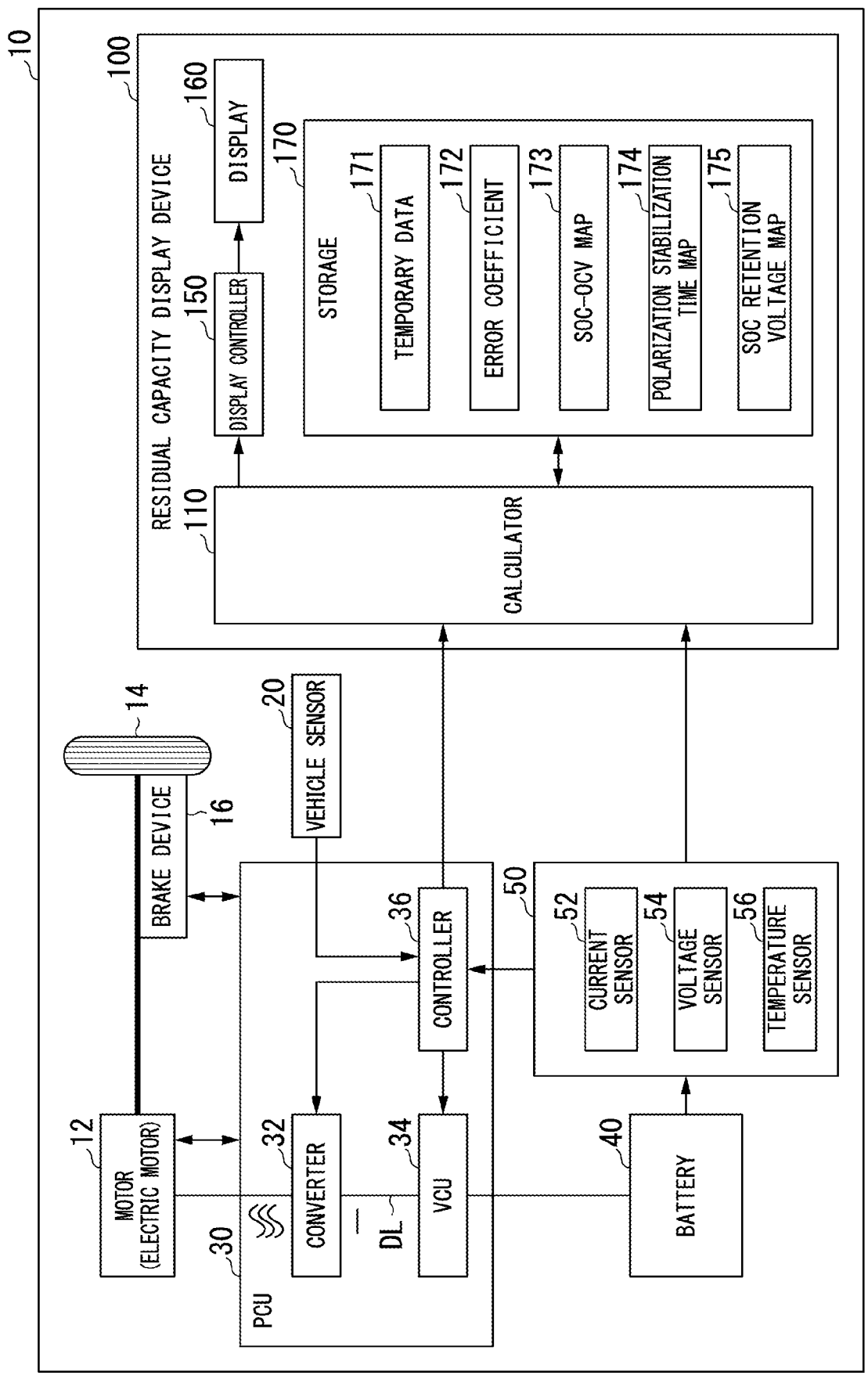
FIG. 1 is a diagram showing an example of a configuration of a vehicle including a residual capacity display device.

Hereinafter, a method of displaying a residual capacity of a secondary battery, a display device, and a motor-driven vehicle according to an embodiment of the invention will be described with reference to the accompanying drawings. FIG. 1 is a diagram showing an example of a configuration of a vehicle 10 including a residual capacity display device 100. A residual capacity display device 100 according to this embodiment displays on a display 160 a residual capacity of a battery (which is hereinafter assumed to be synonymous with a secondary battery) which is mounted in a vehicle 10. The vehicle 10 is a motor-driven vehicle and is, for example, an electric vehicle including an electric motor (a motor), but may be a so-called hybrid vehicle including an engine and an electric motor.

As shown in FIG. 1, the vehicle 10 includes, for example, a motor 12, driving wheels 14, a brake device 16, a vehicle sensor 20, a power control unit (PCU) 30, a battery 40, a battery sensor 50, and a residual capacity display device 100. The motor 12 is, for example, a three-phase AC electric motor. A rotor of the motor 12 is connected to the driving wheels 14. The motor 12 outputs power to the driving wheels 14 using electric power which is supplied thereto. The motor 12 generates electric power using the kinetic energy of the vehicle at the time of deceleration of the vehicle.

The brake device 16 includes, for example, a brake caliper, a cylinder that transmits a hydraulic pressure to the brake caliper, and an electric motor that generates a hydraulic pressure in the cylinder. The brake device 16 may include a mechanism for transmitting a hydraulic pressure generated by an operation of a brake pedal to the cylinder via a master cylinder as a backup. The brake device 16 is not limited to the above configuration, and may be an electronically controlled hydraulic brake device that transmits the hydraulic pressure of the master cylinder to the cylinder.

The vehicle sensor 20 includes an accelerator depression sensor, a vehicle speed sensor, and a brake depression sensor. The accelerator depression sensor is attached to an accelerator pedal which is an example of an operator receiving an acceleration instruction from a driver who is an occupant, detects an amount of depression of the accelerator pedal, and outputs the detected amount of depression as an accelerator depression amount to a controller 36. The vehicle speed sensor includes, for example, a wheel speed sensor attached to each wheel and a speed calculator, derives a speed of the vehicle (a vehicle speed) by combining wheel speeds detected by the wheel speed sensors, and outputs the derived speed to the PCU 30. The brake depression sensor is attached to a brake pedal, detects an amount of depression of the brake pedal, and outputs the detected amount of depression as a brake depression amount to the PCU 30.

The PCU 30 includes, for example, a converter 32, a voltage control unit (VCU) 34, and a controller 36. A configuration in which these elements are unified as a single PCU 30 is only an example, and these elements may be arranged in a distributed manner. The vehicle speed output from the wheel speed sensors and the brake depression amount output from the brake depression sensor are input to the controller 36 of the PCU 30.

The converter 32 is, for example, an AC-DC converter. A DC-side terminal of the converter 32 is connected to a DC link DL. The DC link DL is connected to the battery 40 via the VCU 34. The converter 32 converts AC power generated by the motor 12 into DC power and outputs the DC power to the DC link DL. The VCU 34 is, for example, a DC-DC converter. The VCU 34 steps up electric power which is supplied from the battery 40 and outputs the stepped-up electric power to the DC link DL.

The controller 36 includes, for example, a motor controller, a brake controller, and a battery/VCU controller. The motor controller, the brake controller, and the battery/VCU controller may be replaced with individual controllers, for example, controllers such as a motor ECU, a brake ECU, and a battery ECU, respectively.

The motor controller controls the motor 12 on the basis of the output of the vehicle sensor 20. The brake controller controls the brake device 16 on the basis of the output of the vehicle sensor 20. The battery/VCU controller generates instruction information for the VCU 34 on the basis of the output of the battery sensor 50 attached to the battery 40 or the like and outputs the generated instruction information to the VCU 34. The VCU 34 increases the voltage of the DC link DL in accordance with an instruction from the battery/VCU controller. The controller 36 outputs an IG-ON signal to the residual capacity display device 100 when the motor controller increases an amount of control of the motor 12 (an amount of operation of the motor 12) from zero (starts the motor 12). The controller 36 outputs an IG-OFF signal to the residual capacity display device 100 when the amount of control of the motor is made to be zero (the motor 12 is stopped).

The battery 40 is a secondary battery such as a lithium-ion battery. The battery 40 stores electric power which is supplied from an external charger outside the vehicle 10 and performs discharging for traveling of the vehicle 10. The battery sensor 50 includes, for example, a current sensor 52, a voltage sensor 54, and a temperature sensor 56.

The current sensor 52 measures and detects a current value of a charging/discharging current of the battery 40. The current sensor 52 outputs the detected current value of the battery 40 to the controller 36 and the residual capacity display device 100. The voltage sensor 54 detects a voltage value of the battery 40. A voltage which is detected by the voltage sensor 54 is a closed-circuit voltage (CCV) (also referred to as a "closed voltage"). The voltage sensor 54 outputs the detected voltage value of the battery 40 to the controller 36 and the residual capacity display device 100. The temperature sensor 56 detects a temperature of the battery 40. The temperature sensor 56 outputs the detected temperature of the battery 40 to the controller 36 and the residual capacity display device 100.

The residual capacity display device 100 includes, for example, a calculator 110, a display controller 150, a display 160, and a storage 170. The calculator 110 and the display controller 150 are realized, for example, by causing a hardware processor such as a central processing unit (CPU) to execute a program (software). Some or all of such elements may be realized in hardware (which includes circuitry) such as a large scale integration (LSI), an application specific integrated circuit (ASIC), or a field-programmable gate array (FPGA), or a graphics processing unit (GPU) or may be realized by software and hardware in cooperation. The program may be stored in a storage device such as a hard disk drive (HDD) or a flash memory (a non-transitory storage medium) in advance, or may be installed in the HDD or the flash memory by storing the program in a removable storage medium (a non-transitory storage medium) such as a DVD or a CD-ROM and setting the storage medium in a drive device. The storage 170 is realized by the above-mentioned storage device.

The storage 170 stores, for example, temporary data 171, an error coefficient 172, an SOC-OCV map 173, a polarization stabilization time map 174, and an SOC retention voltage map 175. The temporary data 171 is data including information which is output from the calculator 110, or the like. The error coefficient 172 is a coefficient which is used when an error estimator 123 which will be described later estimates a range in which an error of an SOC estimated value occurs (hereinafter referred to as a current error range) based on a current value measured by the current sensor 52. The storage 170 stores a first error coefficient α (α≥0) and a second error coefficient β (β<0) as the error coefficient 172.

The SOC-OCV map 173 is a map which is used to calculate an SOC on the basis of an OCV and includes an SOC-OCV curve. The polarization stabilization time map 174 is a map which is used to calculate a time until polarization of the battery 40 is stabilized (hereinafter referred to as a polarization stabilization time) at the time of starting of supply of electric power of the battery 40. The polarization stabilization time map 174 represents a relationship between the temperature and SOC of the battery 40 and the polarization stabilization time.

The SOC retention voltage map 175 is a map representing a range in which the SOC-OCV map 173 is likely to change with deterioration of the battery 40. An SOC retention voltage range can be appropriately determined depending on the type of the battery 40 or the like and may be, for example, a range of 3.4 [V] to 4.0 [V] or a range of 3.6 [V] to 3.8 [V].

In the embodiment, a time in which electric power is supplied to the battery 40 to operate the motor 12 and the vehicle 10 is traveling is referred to as a "traveling time," a time in which supply of electric power of the battery 40 is stopped and the motor 12 and the vehicle 10 are stopped is referred to as a "stopping time" or an "IG-OFF time," and a time in which the motor 12 is started after being stopped is referred to as a "starting time" or an "IG-ON time." The stopping time and the IG-OFF time are a time in which supply of electric power of the battery 40 is stopped, and the starting time and the IG-ON time are a time in which supply of electric power of the battery 40 is started.

The calculator 110 calculates the SOC of the battery 40 on the basis of at least an estimated value of the open-circuit voltage of the battery 40. In the embodiment, the calculator 110 calculates the SOC of the battery 40 on the basis of the open-circuit voltage of the battery 40 and an integrated value of a charging/discharging current of the battery 40. Additionally, the calculator 110 calculates the open-circuit voltage of the battery 40 and calculates the SOC on the basis of a relationship between the open-circuit voltage and the SOC. The relationship between the open-circuit voltage and the SOC is represented by, for example, the SOC-OCV map 173. The calculator 110 calculates a change in SOC on the basis of the integrated value of the charging/discharging current of the battery 40 using the SOC (hereinafter referred to as an OCV-SOC) which is calculated on the basis of the relationship between the open-circuit voltage and the SOC or the like as an initial value, and calculates an SOC in which the OCV-SOC and the change in SOC based on the integrated value of the charging/discharging current are used together (blended) (hereinafter referred to as a blended SOC).

Figure 2:
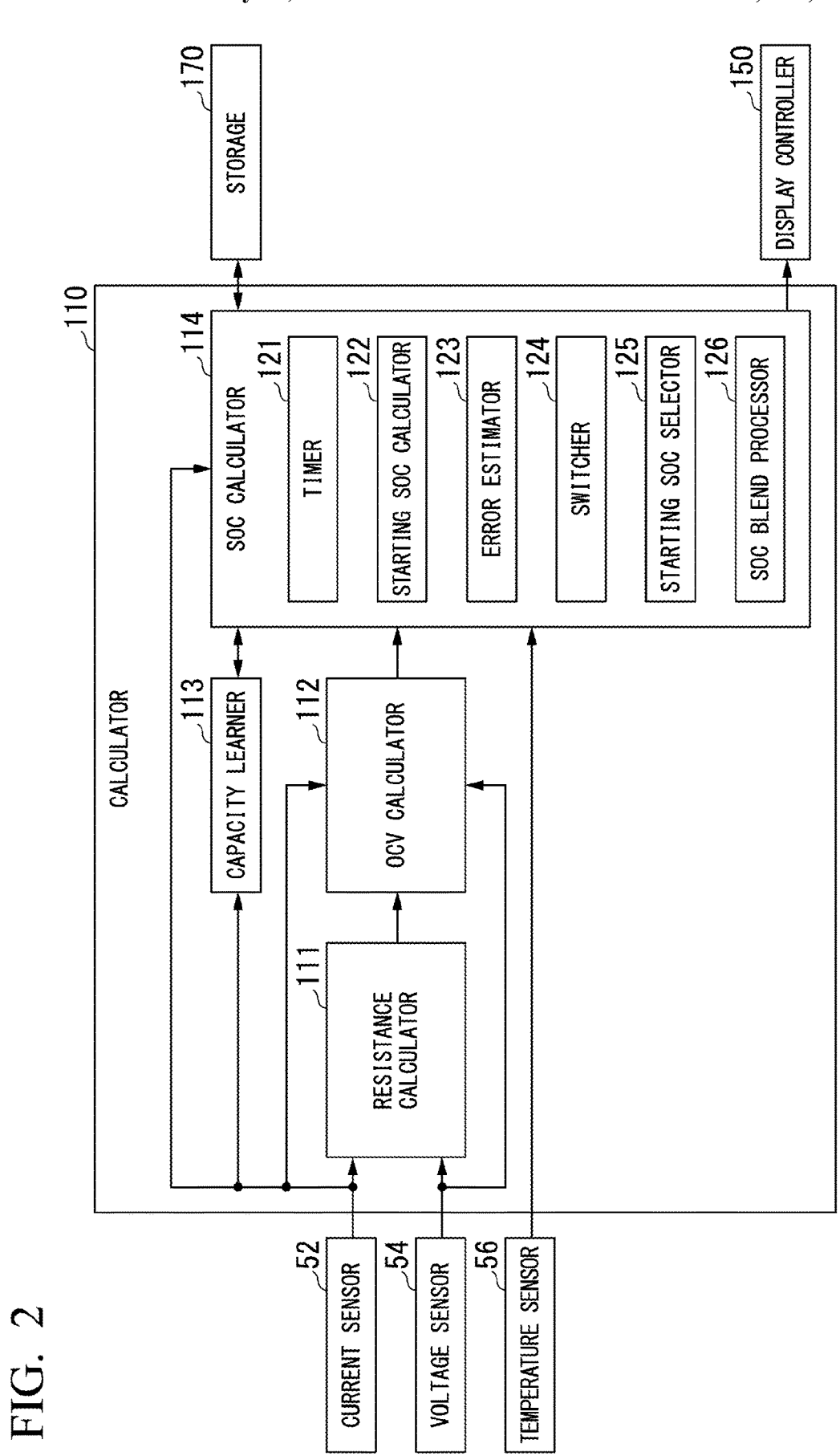
FIG. 2 is a functional configuration diagram showing a function of a calculator.

FIG. 2 is a functional configuration diagram showing a function of the calculator 110. As shown in FIG. 2, the calculator 110 includes, for example, a resistance calculator 111, an OCV calculator 112, a capacity learner 113, and an SOC calculator 114.

The resistance calculator 111 calculates a resistance value R using Expression (1) based on a differential value dI of a current value I which is output from the current sensor 52 and a differential value dV of a voltage value V which is output from the voltage sensor 54. The resistance calculator 111 calculates internal resistance at the time of charging and discharging in the battery 40 using Expression (1). The resistance calculator 111 outputs the calculated resistance value R to the OCV calculator 112.

$$R = dV/dI \qquad (1)$$

The OCV calculator 112 calculates an OCV using Expression (2) on the basis of the current value I which is output from the current sensor 52, the voltage value V=CCV which is output from the voltage sensor 54, and the resistance value R which is output from the resistance calculator 111. The OCV calculated by the OCV calculator 112 is an OCV estimated value. The OCV calculator 112 calculates the OCV estimated value every predetermined time, for example, every second, and outputs the calculated OCV estimated value to the SOC calculator 114. The predetermined time is arbitrary and may be, for example, 5 seconds or 10 seconds or may be 100 [ms] or 500 [ms].

$$OCV = CCV + IR \qquad (2)$$

The capacity learner 113 learns a capacity Cap using Expression (3) on the basis of a differential value dAh of an amount of current Ah based on the current value which is output from the current sensor 52 and a differential value dSOC of the SOC (the SOC estimated value) which is calculated by the SOC calculator 114. The capacity learner 113 outputs the learned capacity Cap as a capacity learning value to the SOC calculator 114.

$$Cap = dAh/dSOC \qquad (3)$$

The SOC calculator 114 calculates the SOC estimated value indicating the SOC of the battery 40, and outputs the calculated SOC estimated value as an SOC display value to the display controller 150. When an IG-OFF signal is output from the controller 36, the SOC calculator 114 stores the SOC estimated value at that time as the temporary data 171 of an IG-OFF SOC in the storage 170. The SOC calculator 114 calculates the SOC estimated value using information such as the IG-OFF SOC which is stored in the storage 170 or the OCV estimated value which his output from the OCV calculator 112. The function of the SOC calculator 114 will be described below in more detail.

The SOC calculator 114 includes, for example, a timer 121, a starting SOC calculator 122, an error estimator 123, a switcher 124, a starting SOC selector 125, and an SOC blend processor 126. The timer 121 is, for example, a so-called real-time clock which is configured as an integrated circuit having a time measuring function which is mounted in the calculator 110. The timer 121 starts measuring a rest time when an IG-OFF signal is output to the calculator 110 by the controller 36, and then measures the rest time until an IG-ON signal is output to the calculator 110 by the controller 36. The rest time is a time from an IG-OFF time (when supply of electric power of the battery 40 is stopped) to an IG-ON time (when supply of electric power of the battery 40 is started).

The starting SOC calculator 122 calculates an OCV-SOC at a time at which the motor 12 is started. The starting SOC calculator 122 reads the SOC-OCV map 173 stored in the storage 170 in calculating the OCV-SOC. The starting SOC calculator 122 applies the OCV estimated value which is output from the OCV calculator 112 to the SOC-OCV map 173 and calculates an SOC corresponding to the OCV estimated value. The starting SOC calculator 122 outputs the calculated OCV-SOC to the starting SOC selector 125.

The error estimator 123 estimates a current error range. A current error which causes the current error range is a value which is set on the basis of an error in calculating the SOC of the battery 40, and includes a measurement error based on the current sensor 52 that measures the charging/discharging current of the battery 40 and an estimation error which is caused when the SOC estimated value of the battery 40 is estimated on the basis of the result of measurement of the current sensor 52. The current error can be at least one of the measurement error based on the current sensor 52 and the estimation error which is caused when the SOC estimated value is estimated. In the embodiment, the current error includes both the measurement error based on the current sensor 52 and the estimation error which is caused when the SOC estimated value is estimated. The current error range extends to a range which increases positively and decreases negatively almost in proportion to the elapse of time.

The error estimator 123 reads the error coefficient 172 (a first error coefficient α and a second error coefficient β) which is stored in the storage 170 in estimating the current error range. On the basis of the read error coefficient 172, the error estimator 123 calculates a current error upper limit Ulim which is an SOC corresponding to the upper limit value of the current error using Expression (4) and calculates a current error lower limit Llim which is an SOC corresponding to the lower limit value of the current error using Expression (5). In Expressions (4) and (5), t denotes a time elapsing from the time of starting of supply of electric power of the battery 40 and can be set to, for example, one cycle when a cycle in which the switcher 124 outputs a previous value 1/z to the SOC blend processor 126 is defined as one cycle as will be described later.

$$Ulim = \alpha \times t \qquad (4)$$

$$Llim = \beta \times t \qquad (5)$$

The current error range is a range between the current error upper limit Ulim and the current error lower limit Llim.

The error estimator 123 estimates the current error range on the basis of the current error upper limit Ulim and the current error lower limit Llim. The error estimator 123 outputs the estimated error current range between the current error upper limit Ulim and the current error lower limit Llim to the SOC blend processor 126.

Figure 3:
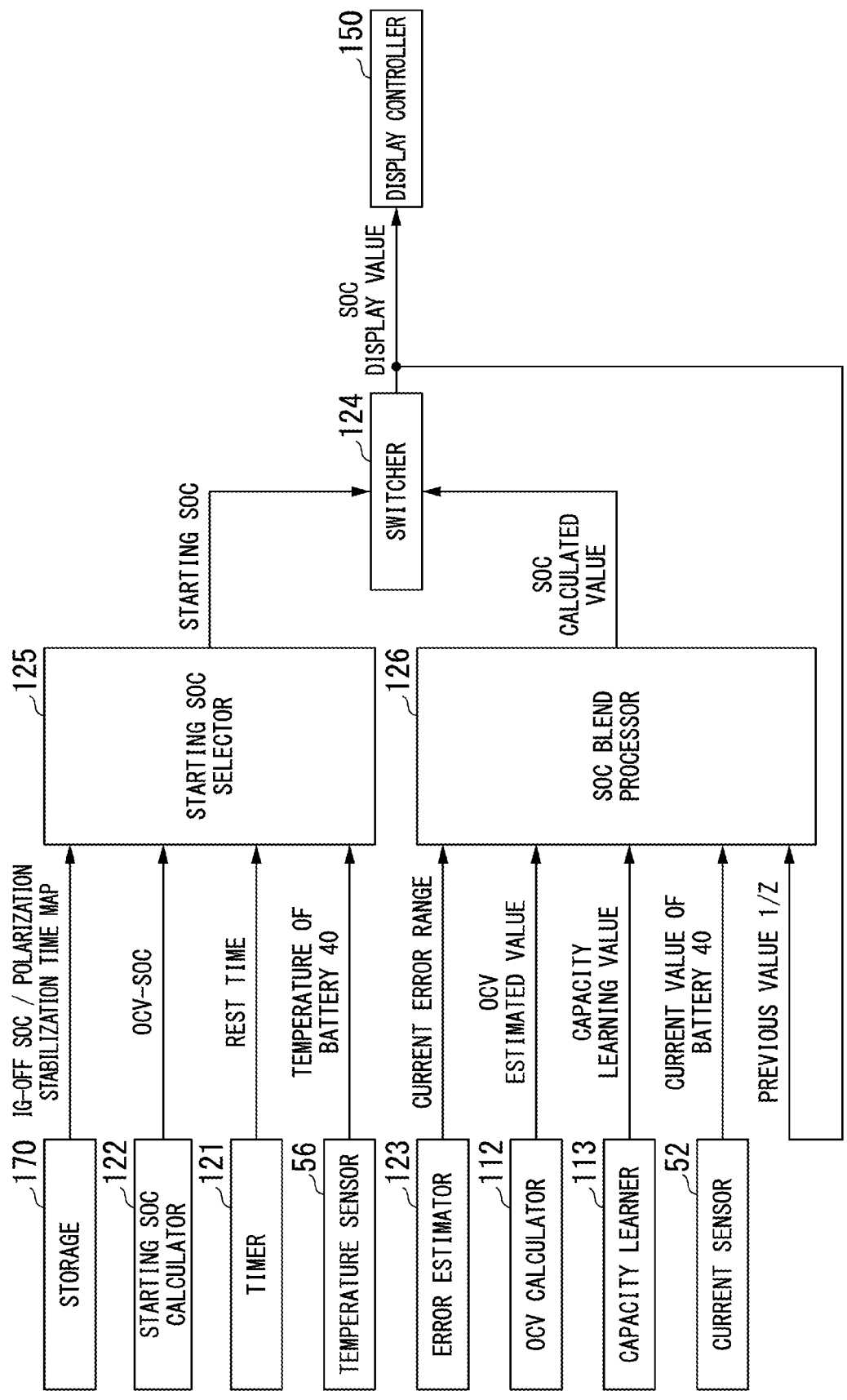
FIG. 3 is a diagram showing information which is input to and output from a switcher, a starting SOC selector, and an SOC blend processor.

Information which is input to and output from the switcher 124, the starting SOC selector 125, and the SOC blend processor 126 will be described below before describing the functions of the switcher 124, the starting SOC selector 125, and the SOC blend processor 126. FIG. 3 is a diagram showing information which is input to and output from the switcher 124, the starting SOC selector 125, and the SOC blend processor 126. As shown in FIG. 3, the temperature of the battery 40 detected by the temperature sensor 56, the rest time measured by the timer 121, and the OCV-SOC calculated by the starting SOC calculator 122 are input to the starting SOC selector 125. The starting SOC selector 125 reads the IG-OFF SOC and the polarization stabilization time map from the storage 170.

The current value of the charging/discharging current of the battery 40 detected by the current sensor 52, the OCV estimated value calculated by the OCV calculator 112, the capacity learned value acquired by the capacity learner 113, the current error range estimated by the error estimator 123, and the SOC previous value 1/z from the switcher 124 are input to the SOC blend processor 126. The starting SOC selected by the starting SOC selector 125 and the SOC calculated value calculated by the SOC blend processor 126 are input to the switcher 124.

The switcher 124 switches the SOC display value which is output to the display controller 150 between the starting SOC selected by the starting SOC selector 125 and the blended SOC calculated by the SOC blend processor 126. The switcher 124 outputs the starting SOC selected by the starting SOC selector 125 as the SOC display value which is output to the display controller 150 to the display controller 150 at the time of starting of supply of electric power of the battery 40. Subsequently, the switcher 124 sets the blended SOC calculated by the SOC blend processor 126 as the SOC display value which is output to the display controller 150. The switcher 124 outputs the SOC display value which is output to the display controller 150 as the SOC previous value 1/z to the SOC blend processor 126. The switcher 124 clears the SOC previous value 1/z at the time of IG-OFF.

When the switcher 124 selects the SOC display value which is to be output to the display controller 150 by the starting SOC selector 125, the starting SOC selector 125 selects the starting SOC which is the SOC estimated value at the time of starting of supply of electric power of the battery 40. The starting SOC selector 125 reads the IG-OFF SOC which is stored in the storage 170. The starting SOC selector 125 selects the starting SOC on the basis of the OCV-SOC which is output from the starting SOC calculator 122 and the IG-OFF SOC which is read from the storage 170. The starting SOC selector 125 uses the polarization stabilization time which is acquired using the rest time and the polarization stabilization time map 174 to select the starting SOC. The starting SOC selector 125 outputs the selected starting SOC as the SOC display value to the display controller 150 via the switcher 124.

When the switcher 124 selects the SOC display value which is to be output to the display controller 150 by the SOC blend processor 126, the SOC blend processor 126 calculates the blended SOC which is the SOC estimated value at the time of traveling of the vehicle 10. The SOC blend processor 126 sets the SOC previous value 1/z which is output from the switcher 124 as the SOC initial value $SOC_{ini}$ and calculates the blended SOC (the SOC expressed by Expression (6)) using Expression (6) on the basis of a current integrated value which is an integrated value of the current value of the battery 40 output from the current sensor 52 and a capacity Cap output from the capacity learner 113.

$$SOC = SOC_{ini} + \frac{\int_0^{\tau} Idt}{\text{Cap}} \quad (6)$$

The SOC blend processor 126 compares the calculated blended SOC with the current error range which is output from the error estimator 123 and calculates the SOC calculated value which is output to the display controller 150 on the basis of the result of comparison. In this way, the SOC blend processor 126 calculates the SOC display value within a range with a predetermined upper limit value and a predetermined lower limit value with respect to the IG-OFF SOC of the battery 40.

The display controller 150 performs control for displaying the SOC display value output from the SOC calculator 114 on the display 160. The display controller 150 displays the blended SOC on the display 160 at the time of traveling of the vehicle 10 and displays the starting SOC on the display 160 at the time of stopping and starting of the motor 12. The display controller 150 may not display the SOC display value at the time of stopping of the motor 12 (at the time of stopping of supply of electric power of the battery 40).

The display 160 displays the SOC display value of the battery 40 under the control of the display controller 150. The display 160 is a display device that is provided, for example, at a position which is visible from a gap of a steering wheel or over the steering wheel by a driver. The display 160 may be provided at another position, for example, at the center of an instrument panel. For example, the display 160 displays an image corresponding to a navigation process which is performed by a navigation system (not shown) mounted in the vehicle 10 or displays an image of an opponent in television call. The display 160 may display a television program, reproduce a DVD, or display contents such as downloaded movie.

Figure 4:
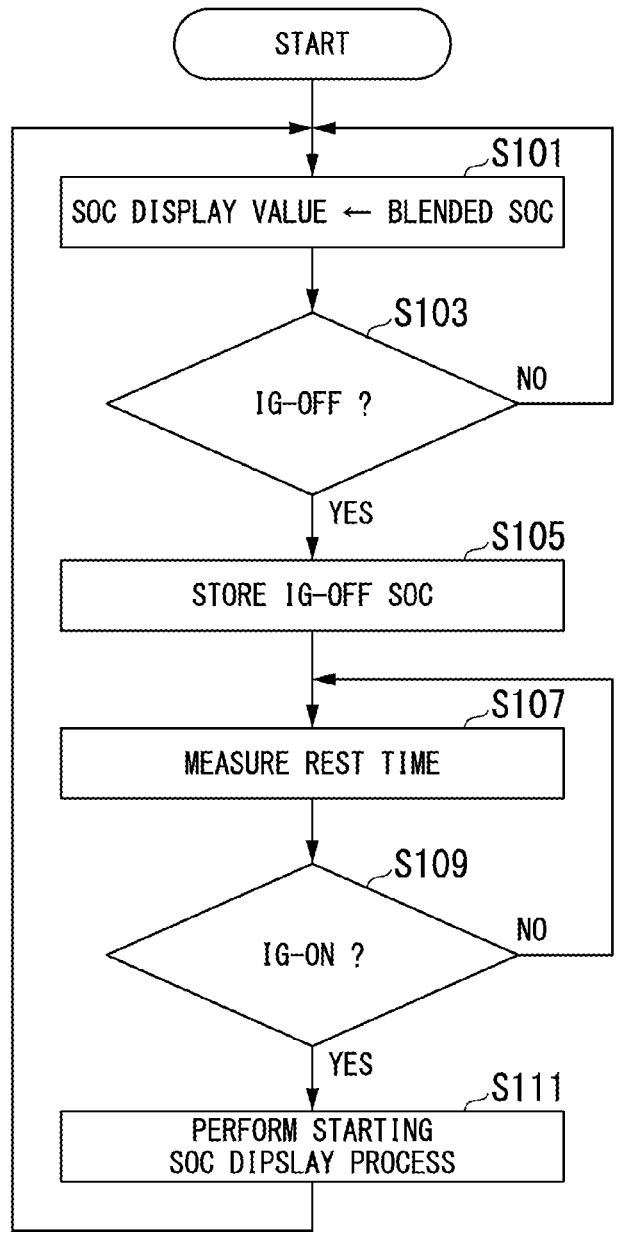
FIG. 4 is a flowchart showing an example of a process flow which is performed in the residual capacity display device.

An example of a process which is performed by the residual capacity display device 100 will be described below. Here, it is assumed that the vehicle 10 stops in a traveling state, starts after the stopping, and restarts traveling. FIG. 4 is a flowchart showing an example of a process flow which is performed in the residual capacity display device 100. While the vehicle 10 is traveling, the calculator 110 outputs the blended SOC calculated by the SOC blend processor 126 as the SOC display value to the display controller 150 (Step S101).

Subsequently, the SOC calculator 114 determines whether an IG-OFF signal has been input and an IG-OFF state has started (whether the motor 12 has stopped) (Step S103). When it is determined that the IG-OFF state has not started, the SOC calculator 114 returns to Step S101 and performs a process of outputting the blended SOC calculated by the SOC blend processor 126 as the SOC display value to the display controller 150.

When it is determined that the IG-OFF state has started, the SOC calculator 114 stores the blended SOC at that time (at the IG-OFF time) as the temporary data 171 of the IG-OFF SOC in the storage 170 (Step S105). Subsequently, the timer 121 measures the rest time which is a time in which the motor 12 stops (Step S107).

Subsequently, the SOC calculator 114 determines whether an IG-ON signal has been input and an IG-ON state has started (whether the motor 12 has started) (Step S109). When it is determined that the IG-ON state has not started, the SOC calculator 114 returns to Step S107 and measures the rest time again.

When it is determined that the IG-ON state has started, the SOC calculator 114 performs a starting SOC display process (Step S111). The starting SOC display process will be described later with reference to FIG. 5. The starting SOC display process is performed until the polarization stabilization time elapses from the IG-ON time. After the polarization stabilization time has elapsed, the vehicle 10 is traveling and thus the display controller 150 switches the SOC display value which is output to the display controller 150 to the blended SOC, returns to Step S101, and performs a process of outputting the blended SOC calculated by the SOC blend processor 126 as the SOC display value to the display controller 150. Thereafter, the residual capacity display device 100 repeatedly performs the process flow shown in FIG. 4. While the vehicle 10 is traveling, the blended SOC may be repeatedly calculated, the OCV-SOC may be calculated every predetermined time, for example, every five minutes, and the SOC initial value $SOC_{ini}$ may be changed to calculate the blended SOC. When the SOC initial value $SOC_{ini}$ is changed, the SOC calculator 114 clears the SOC previous value. The starting SOC display process may be performed, for example, in a predetermined time from the IG-ON time instead of the time until the polarization stabilization time elapses from the IG-ON time.

Figure 5:
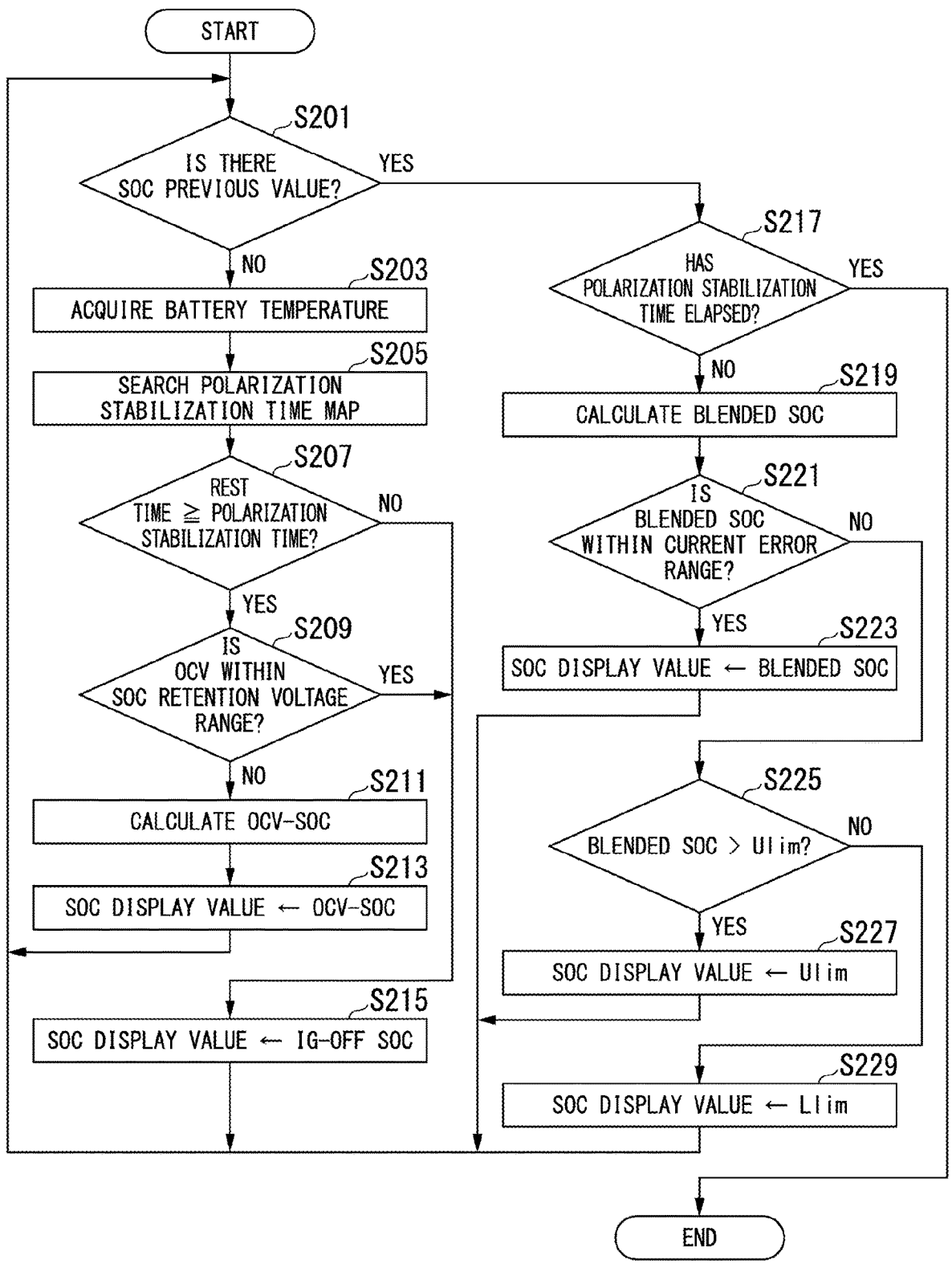
FIG. 5 is a flowchart showing an example of a process flow which is performed in the residual capacity display device.

The starting SOC display process will be described below. FIG. 5 is a flowchart showing an example of a process flow which is performed in the residual capacity display device 100. FIG. 5 shows the starting SOC display process of the process flow which is performed in the residual capacity display device 100. When the starting SOC display process is started, the switcher 124 determines whether switching of the switcher 124 has been performed when the starting SOC selector 125 outputs an SOC display value to the display controller 150 (Step S201).

When it is determined that switching of the switcher 124 has been performed when the starting SOC selector 125 outputs an SOC display value to the display controller 150, the starting SOC selector 125 acquires the temperature of the battery 40 which is output from the temperature sensor 56 (Step S203). Subsequently, the starting SOC selector 125 reads the polarization stabilization time map 174 stored in the storage 170 and acquires a polarization stabilization time by the temperature of the battery 40 output from the temperature sensor 56 and the IG-OFF SOC to the polarization stabilization time map 174 (Step S205). Subsequently, the starting SOC selector 125 determines whether the rest time measured by the timer 121 is equal to or greater than the polarization stabilization time acquired in Step S203 (Step S207).

When it is determined that the rest time is equal to or greater than the polarization stabilization time, the starting SOC selector 125 reads the SOC retention voltage map 175 from the storage 170 and determines whether the OCV estimated value output from the OCV calculator 112 is within an SOC retention voltage range in the SOC retention voltage map 175 (Step S209). When it is determined that the OCV estimated value output from the OCV calculator 112 is not within the SOC retention voltage range, the starting SOC selector 125 reads the SOC-OCV map 173 stored in the storage 170 and calculates the OCV-SOC by applying the OCV estimated value output from the OCV calculator 112 to the SOC-OCV map 173 (Step S211). Subsequently, the starting SOC selector 125 outputs the OCV-SOC as the SOC display value to the display controller 150 (Step S213). Thereafter, the SOC calculator 114 returns to Step S201.

When it is determined in Step S207 that the rest time is not equal to or greater than the polarization stabilization time (the rest time is less than the polarization stabilization time), the starting SOC selector 125 outputs the IG-OFF SOC as the SOC display value to the display controller 150 (Step S215). When it is determined in Step S209 that the OCV estimated value output from the OCV calculator 112 is within the SOC retention voltage range, the starting SOC selector 125 outputs the IG-OFF SOC as the SOC display value to the display controller 150 (Step S215). Thereafter, the SOC calculator 114 returns to Step S201.

When it is determined in Step S201 that switching of the switcher 124 has not been performed when the starting SOC selector 125 outputs the SOC display value to the display controller 150, the switcher 124 performs the process of Step S217. Subsequently, the SOC calculator 114 determines whether the polarization stabilization time has elapsed (Step S217). When it is determined that the polarization stabilization time has not elapsed, the SOC blend processor 126 calculates a blended SOC using Expression (6) on the basis of the SOC previous value 1/z output from the switcher 124 (Step S219).

Subsequently, the SOC blend processor 126 determines whether the calculated blended SOC is within the current error range output from the error estimator 123 (Step S221). When it is determined that the blended SOC is within the current error range, the SOC blend processor 126 outputs the calculated blended SOC as the SOC display value to the display controller 150 (Step S223). Thereafter, the SOC blend processor 126 returns to Step S201.

When it is determined that the blended SOC is not within the current error range, the SOC blend processor 126 determines whether the calculated blended SOC is greater than the current error upper limit Ulim (Step S225). When it is determined that the calculated blended SOC is greater than the current error upper limit Ulim, the SOC blend processor 126 outputs the current error upper limit Ulim as the SOC display value to the display controller 150 (Step S227). Thereafter, the SOC blend processor 126 returns to Step S201.

When the calculated blended SOC is not greater than the current error upper limit Ulim, the calculated blended SOC is less than the current error lower limit Llim. When it is determined that the calculated blended SOC is not greater than the current error upper limit Ulim, the SOC blend processor 126 output the current error lower limit Llim as the SOC display value to the display controller 150 (Step S229). Thereafter, the SOC blend processor 126 returns to Step S201.

When it is determined in Step S217 that the polarization stabilization time has elapsed, the SOC calculator 114 ends the process flow shown in FIG. 5 and returns to Step S101 in FIG. 4.

The residual capacity display device 100 according to the embodiment causes the display controller 150 to display the SOC of the battery 40 on the display 160. The residual capacity display device 100 causes the display controller 150 to display the calculated blended SOC on the display 160 using an integrated value of the charging/discharging current of the battery 40. In this way, by using the open-circuit voltage and the integrated value of the charging/ discharging current of the battery 40, it is possible to calculate an accurate value as the SOC display value and to display the calculated value on the display 160.

The residual capacity display device 100 displays the stopping SOC (the IG-OFF SOC) of the vehicle 10 (the motor 12) on the display 160 in addition to the OCV-SOC at the time of starting of the motor 12. Accordingly, the residual capacity display device 100 can curb an unnatural decrease of the SOC display value which is displayed on the display 160 at the time of starting of the motor 12, and thus it is possible to decrease an uncomfortable feeling which is given to an occupant.

Figure 6:
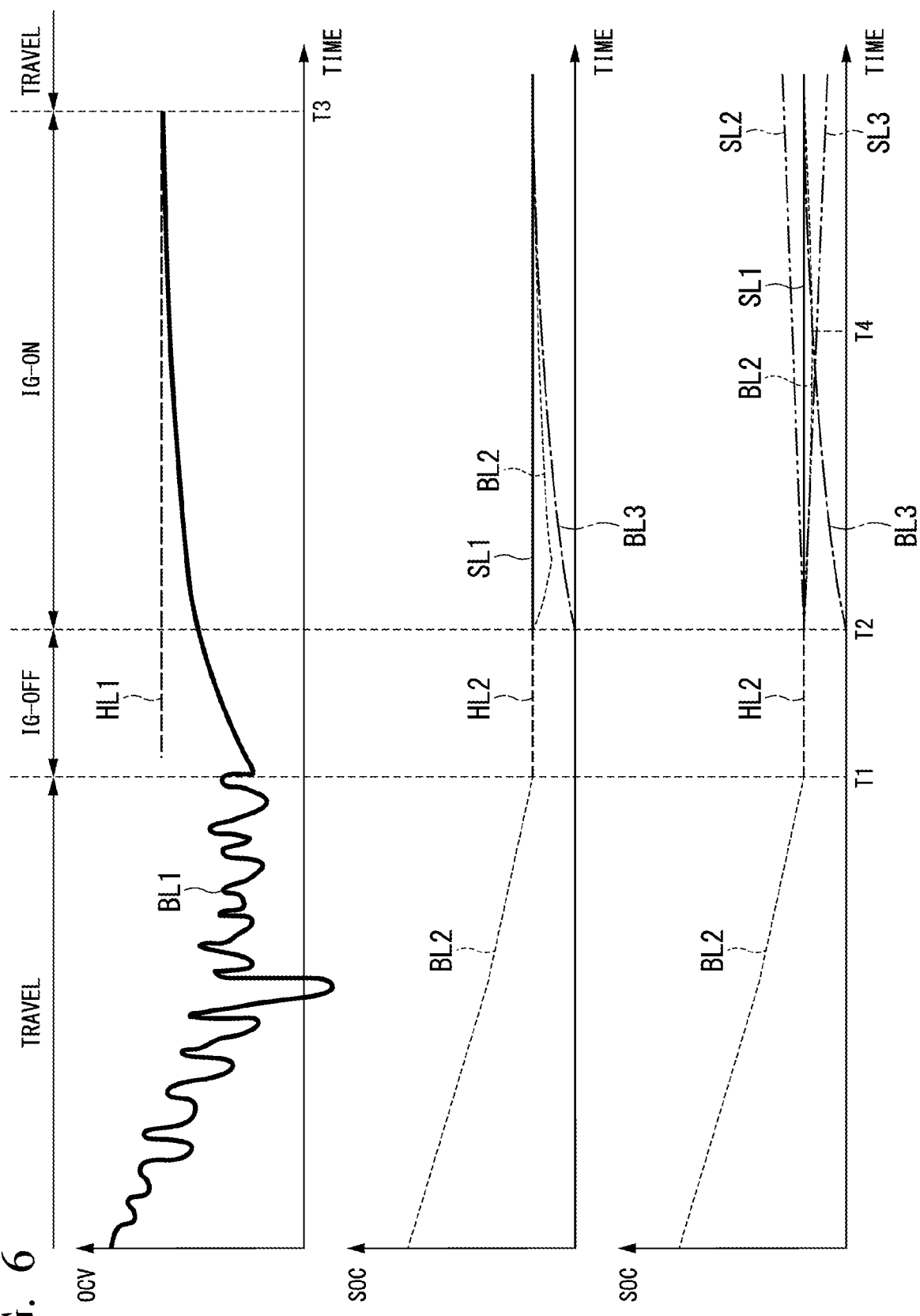
FIG. 6 is a diagram showing an example of change of an OCV estimated value, an SOC estimated value, and an SOC display value of a battery.

Now, an example of change of the OCV estimated value, the SOC estimated value, and the SOC display value of the battery 40 in the course from the traveling time of the vehicle 10 to the traveling time of the vehicle 10 via the IG-OFF time (the stopping time of the motor 12) and the IG-ON time (the starting time of the motor 12) will be described. FIG. 6 is a diagram showing an example of change of the OCV estimated value, the SOC estimated value, and the SOC display value of the battery 40. In FIG. 6, a first time T1 is a time at which the vehicle 10 stops (the IG-OFF time at which the motor 12 stops), a second time T2 is a time at which the motor 12 starts (the IG-ON time at which the IG-OFF time ends), and a third time T3 is a time at which the vehicle 10 travels (the IG-ON time ends). The time from the first time T1 to the third time T3 is the polarization stabilization time. In the following description, the time up to the first time T1 and the time after the third time T3 are referred to as a "traveling time of the vehicle 10," the time from the first time T1 to the second time T2 is referred to as an "IG-OFF time," and the time from the second time T2 to the third time T3 is referred to as an "IG-ON time."

As shown in the upper part of FIG. 6, the OCV estimated value of the battery 40 indicated by a first curve BL1 decreases gradually while repeatedly increasing and decreasing finely when the vehicle 10 is traveling. Subsequently, at the first time T1, the OCV estimated value decreases due to polarization, but the OCV estimated value restores gradually with a decrease in an influence of polarization. The true value of the OCV is, for example, a numerical value indicated by a first dotted line HL1. At the third time T3 via the second time T2, the true value of the OCV has almost the same numerical value as the actual OCV when the vehicle 10 is traveling.

In the medium part of FIG. 6, the blended SOC is indicated by a second curve BL2, the stopping SOC (the IG-OFF SOC) of the vehicle 10 is indicted by a first straight line SL1, and the OCV-SOC is indicated by a third curve BL3. Since there is no load on the battery 40 at the IG-OFF time, the blended SOC at the IG-OFF time is a blended SOC at the time of stopping of the vehicle 10.

The blended SOC which is the SOC estimated value of the battery 40 indicated by the second curve BL2 decreases gradually with the elapse of time when the vehicle 10 is traveling. Subsequently, the SOC estimated value is stored in the storage 170 at the first time T1 and serves as an initial value when the blended SOC after the traveling time of the vehicle 10 from the IG-ON time via the IG-OFF time is estimated. Subsequently, at the IG-ON time, the blended SOC is calculated as being decreased due to the current error even when there is no load on the motor 12. The OCV-SOC indicated by the third curve BL3 becomes less than the actual SOC due to polarization. The true value of the SOC is, for example, a numerical value indicated by a second dotted line HL2. Accordingly, since the blended SOC and the OCV-SOC are both less than the true value of the SOC, the SOC display value may decrease unnaturally to give an uncomfortable feeling to an occupant when the blended SOC or the OCV-SOC is displayed as the SOC display value on the display 160 at the time of starting of the motor 12.

Accordingly, the residual capacity display device 100 according to the embodiment displays the stopping SOC of the vehicle 10 (the motor 12) (the blended SOC) at the time of starting of the motor 12 on the display 160. At the IG-ON time, the current error upper limit Ulim or the current error lower limit Llim is set as the SOC display value when the blended SOC is out of the current error range. For example, between the second time T2 and the fourth time T4 in the lower part of FIG. 5, when the third curve BL3 indicating the OCV-SOC departs from between the second straight line SL2 indicating the current error upper limit Ulim and the third straight line SL3 indicating the current error lower limit Llim and the third curve BL3 is less than the third straight line SL3, the current error lower limit Llim is set as the SOC display value. Accordingly, it is possible to curb an unnatural decrease of the SOC display value which is displayed on the display 160 and to decrease an uncomfortable feeling which is given to an occupant. When the third curve BL3 is less than the third straight line SL3, the current error lower limit Llim is not set as the SOC display value but the blended SOC at the time of stopping of the vehicle 10 may be set as the SOC display value.

At the fourth time T4, the third curve BL3 is located between the second straight line SL2 and the third straight line SL3. Thereafter, the OCV-SOC is displayed as the SOC display value on the display 160. Accordingly, a value close to the actual SOC can be displayed as the SOC display value on the display 160. Since fluctuation of the SOC display value which is displayed on the display 160 can be prevented from increasing excessively, the value of the SOC which is displayed on the display 160 cannot fluctuate greatly even when it progresses from the IG-ON time to the traveling time of the vehicle 10, and it is possible to further decrease an uncomfortable feeling which is given to an occupant.

Figure 7:
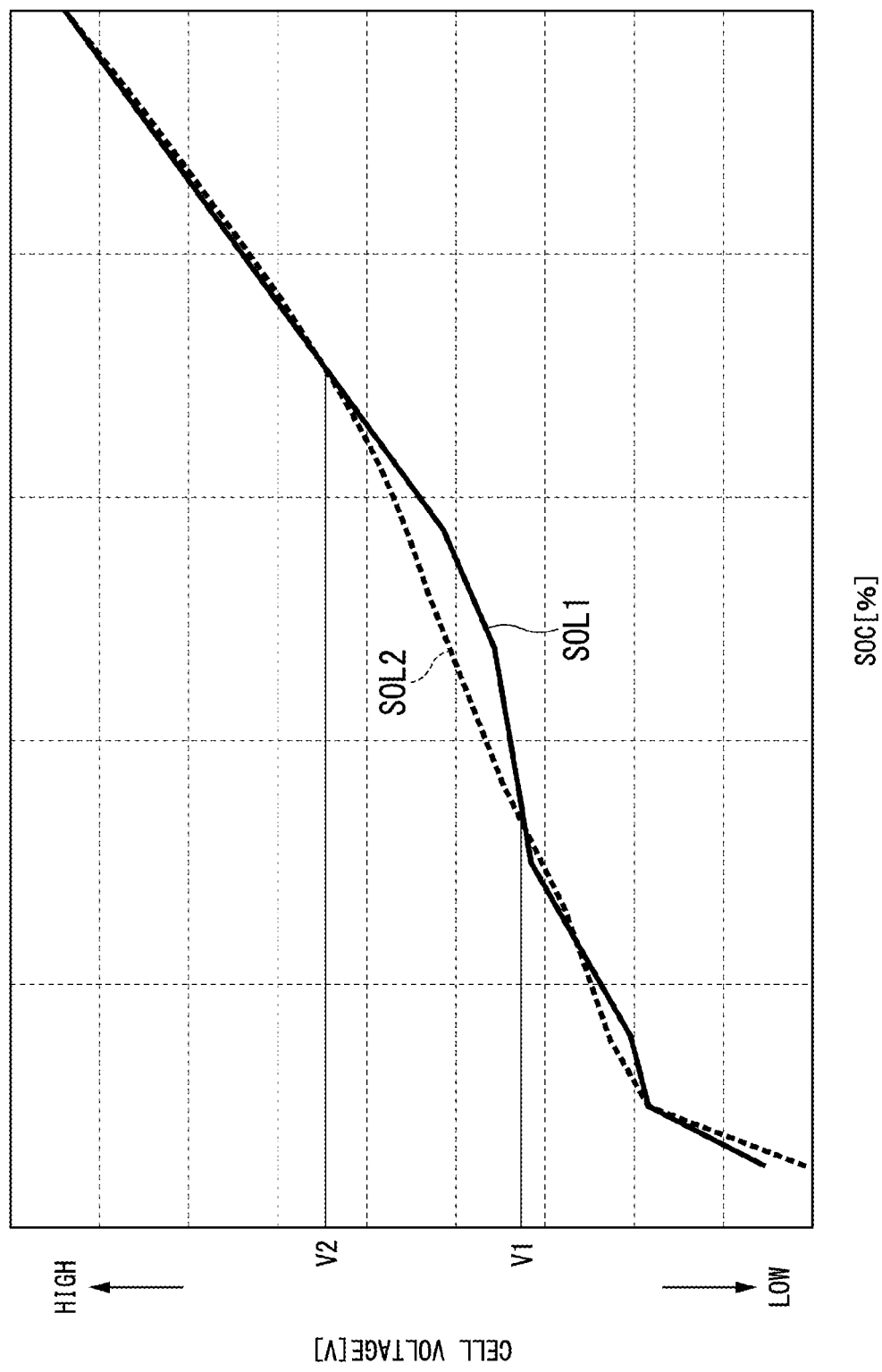
FIG. 7 is a diagram showing an example of an SOC-OCV curve.

When deterioration with use of the battery 40 progresses, the SOC-OCV curve included in the SOC-OCV map 173 changes. FIG. 7 is a diagram showing an example of the SOC-OCV curve. In FIG. 7, the SOC-OCV curve of the battery 40 which is a new product is indicated by a first SOC-OCV curve SOL1, and the SOC-OCV curve of the battery 40 of which deterioration has progressed is indicated by a second SOC-OCV curve SOL2. Ina range less than a first voltage V1 and a range greater than a second voltage V2 which are shown in FIG. 7, the first SOC-OCV curve SOL1 and the second SOC-OCV curve SOL2 almost overlap each other. Accordingly, in the range less than the first voltage V1 and the range greater than a second voltage V2, the SOC-OCV curve does not change greatly even when the battery 40 deteriorates. However, in a range from the first voltage V1 to the second voltage V2, the SOC at a voltage value corresponding to the second SOC-OCV curve SOL2 is greater than the SOC at a voltage value corresponding to the first SOC-OCV curve SOL1. Accordingly, in the range from the first voltage V1 to the second voltage V2, there is a likelihood that the SOC estimated value will be greatly out of the true value thereof when the OCV-SOC is calculated on the basis of the OCV estimated value.

Accordingly, the residual capacity display device 100 according to the embodiment sets the SOC retention voltage range to a range corresponding to the range from the first voltage V1 to the second voltage V2 shown in FIG. 7 when the starting SOC selector 125 selects the SOC estimated value. When the OCV estimated value output from the OCV calculator 112 is within the SOC retention voltage range, the OCV-SOC is not calculated by the starting SOC calculator 122 but the IG-OFF SOC is displayed on the display 160. Accordingly, since the SOC estimated value close to the true value of the SOC of the battery 40 can be displayed on the display 160, it is possible to decrease an uncomfortable feeling which is given to an occupant.

While the present invention has been described above with reference to an embodiment, the invention is not limited to the embodiment and can be subjected to various modifications and substitutions without departing from the gist of the invention.

What is claimed is:

1. A method of displaying a residual capacity of a secondary battery, the method causing a computer of a display device to perform:
   calculating the residual capacity of the secondary battery storing electric power for driving a motor-driven vehicle based on at least an estimated value of an open-circuit voltage of the secondary battery;
   storing, in a storage a first residual capacity of the secondary battery, wherein the first residual capacity is calculated at a time of stopping of supply of electric power of the secondary battery;
   displaying the first residual capacity, which is stored in the storage, on a display at a time of starting of supply of electric power of the secondary battery;
   calculating a second residual capacity of the secondary battery based on the first residual capacity and an integrated value of a charging/discharging current of the secondary battery; and
   after displaying the first residual capacity, displaying the second residual capacity on the display within a range with a predetermined upper limit value and a predetermined lower limit value with respect to the first residual capacity to switch from the displaying of the first residual capacity to the displaying of the second residual capacity.

2. The method according to claim 1, wherein the upper limit value and the lower limit value are set based on an error in calculating the residual capacity of the secondary battery.

3. The method according to claim 2, wherein the error is at least one of a measurement error due to a current sensor that is configured to measure the charging/discharging current or an estimation error of the residual capacity of the secondary battery estimated based on a result of measurement from the current sensor.

4. A method of displaying a residual capacity of a secondary battery, the method causing a computer of a display device to perform:
   calculating the residual capacity of the secondary battery storing electric power for driving a motor-driven vehicle based on at least an estimated value of an open-circuit voltage of the secondary battery;
   storing, in a storage, a first residual capacity of the secondary battery,
   wherein the first residual capacity is calculated at a time of stopping of supply of electric power of the secondary battery;
   displaying, on a display at a time of starting of supply of electric power of the secondary battery, a second residual capacity of the secondary battery, wherein the second residual capacity is calculated at the time of starting of supply of electric power of the secondary battery or the first residual capacity;
   calculating a third residual capacity of the secondary battery based on the first residual capacity or the second residual capacity and an integrated value of a charging/discharging current of the secondary battery; and
   after displaying the first residual capacity or the second residual capacity, displaying the third residual capacity on the display within a range with a predetermined upper limit value and a predetermined lower limit value with respect to the displayed first or second residual capacity to switch from the displaying of the first residual capacity or the second residual capacity to the displaying of the third residual capacity.

5. The method according to claim 4, wherein the method causes the computer to perform:
   selecting one of the second residual capacity or the first residual capacity as the residual capacity of the secondary battery to be displayed on the display based on whether a time from stopping of supply of electric power to starting of supply of electric power of the secondary battery is equal to or greater than a time in which polarization at the time of starting of supply of electric power of the secondary battery is stabilized.

6. The method according to claim 5, wherein the method causes the computer to perform:
   selecting the first residual capacity as the residual capacity of the secondary battery to be displayed on the display in a case where the time from stopping of supply of electric power to starting of supply of electric power of the secondary battery is less than the time in which polarization at the time of starting of supply of electric power of the secondary battery is stabilized.

7. The method according to claim 6, wherein the method causes the computer to perform:
   selecting the first residual capacity as the residual capacity of the secondary battery to be displayed on the display in a case in which the time from stopping of supply of electric power to starting of supply of electric power of the secondary battery is equal to or greater than the time in which polarization at the time of starting of supply of electric power of the secondary battery is stabilized and the estimated value of the open-circuit voltage of the secondary battery is within a predetermined range.

8. A residual capacity display device for a secondary battery comprising:
   a calculator configured to calculate a residual capacity of a secondary battery that stores electric power for driving a motor-driven vehicle based on at least an estimated value of an open-circuit voltage of the secondary battery;
   a storage configured to store a first residual capacity of the secondary battery, wherein the first residual capacity is calculated at a time of stopping of supply of electric power of the secondary battery;
   a display configured to display the residual capacity of the secondary battery; and
   a display controller configured to
      display the first residual capacity on the display at a time of starting of supply of electric power of the secondary battery, and
      after displaying the first residual capacity, display, on the display, a second residual capacity of the secondary battery, which is calculated based on the first residual capacity and an integrated value of a charging/discharging current of the secondary battery, within a range with a predetermined upper limit value and a predetermined lower limit value with respect to the first residual capacity to switch from the displaying of the first residual capacity to the displaying of the second residual capacity.

9. A motor-driven vehicle comprising the residual capacity display device for a secondary battery according to claim 8.

* * * * *